US009722212B2

(12) United States Patent
Yamazaki

(10) Patent No.: US 9,722,212 B2
(45) Date of Patent: Aug. 1, 2017

(54) LIGHTING DEVICE, LIGHT-EMITTING DEVICE, AND MANUFACTURING METHOD AND MANUFACTURING APPARATUS THEREOF

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1346 days.

(21) Appl. No.: 13/372,087

(22) Filed: Feb. 13, 2012

(65) Prior Publication Data

US 2012/0208303 A1 Aug. 16, 2012

(30) Foreign Application Priority Data

Feb. 14, 2011 (JP) ................................. 2011-028920

(51) Int. Cl.
   *H01L 21/84* (2006.01)
   *H01L 51/56* (2006.01)
   *H01L 27/32* (2006.01)

(52) U.S. Cl.
   CPC .......... *H01L 51/56* (2013.01); *H01L 27/3246* (2013.01)

(58) Field of Classification Search
   CPC . H01L 51/56; H01L 51/5012; H01L 27/3246; C23C 14/24; C23C 14/34
   USPC .......................................... 438/29, 907, 908
   See application file for complete search history.

(56) References Cited

U.S. PATENT DOCUMENTS

| 4,749,465 | A | * | 6/1988 | Flint | ..................... C23C 14/568 198/465.1 |
| 4,828,668 | A | | 5/1989 | Yamazaki et al. | |
| 5,490,910 | A | * | 2/1996 | Nelson | .................. C23C 14/345 204/192.15 |
| 6,471,837 | B1 | | 10/2002 | Hans et al. | |
| 6,770,562 | B2 | * | 8/2004 | Yamazaki | ............... C23C 14/12 118/715 |

(Continued)

FOREIGN PATENT DOCUMENTS

| EP | 1 260 605 A1 | 11/2002 |
| EP | 1 492 157 A1 | 12/2004 |

(Continued)

OTHER PUBLICATIONS

English Translation of the Detailed Description of JP 2009-224231 from Japan Platform for Patent Information (Mar. 28, 2017).*

*Primary Examiner* — Mary Wilczewski
(74) *Attorney, Agent, or Firm* — Husch Blackwell LLP

(57) ABSTRACT

The sizes of an evaporation mask used for a full-color light-emitting device and an evaporation mask used for a lighting device are different from each other. For this reason, separate evaporation masks are necessary, and in the case of processing a large number of substrates at once, many evaporation masks are prepared in accordance with the number of substrates to be processed, thereby increasing the total footprint of a manufacturing apparatus. One object of the present invention is to solve a problem of such an increase. A full-color display device can be manufactured by using a color filter and white light-emitting elements in combination. By this manner, a manufacturing line for the light-emitting device can have some steps in common with a manufacturing line for the lighting device; consequently, the total footprint of the manufacturing apparatus is reduced.

9 Claims, 7 Drawing Sheets

(56) References Cited

U.S. PATENT DOCUMENTS

| | | | |
|---|---|---|---|
| 6,776,880 B1 | 8/2004 | Yamazaki | |
| 6,794,278 B2 * | 9/2004 | Kido et al. | |
| 6,953,735 B2 * | 10/2005 | Yamazaki | G02F 1/133305 |
| | | | 257/E21.122 |
| 7,060,591 B2 | 6/2006 | Yamazaki et al. | |
| 7,258,768 B2 | 8/2007 | Yamazaki | |
| 7,339,317 B2 | 3/2008 | Yamazaki | |
| 7,387,904 B2 | 6/2008 | Saito et al. | |
| 7,400,087 B2 | 7/2008 | Yamazaki | |
| 7,429,300 B2 | 9/2008 | Kido et al. | |
| 7,446,339 B2 | 11/2008 | Yamazaki et al. | |
| 7,521,268 B2 | 4/2009 | Aoki et al. | |
| 7,785,663 B2 | 8/2010 | Kido et al. | |
| 7,820,231 B2 * | 10/2010 | Yamazaki | C23C 14/042 |
| | | | 118/727 |
| 7,858,411 B2 | 12/2010 | Yamazaki et al. | |
| 7,915,808 B2 | 3/2011 | Yamazaki | |
| 7,994,496 B2 | 8/2011 | Saito et al. | |
| 8,278,135 B2 * | 10/2012 | Yamazaki | C23C 14/12 |
| | | | 257/E21.242 |
| 8,344,369 B2 | 1/2013 | Yamazaki et al. | |
| 8,610,118 B2 | 12/2013 | Yamazaki et al. | |
| 9,123,595 B2 | 9/2015 | Yamazaki et al. | |
| 2001/0006827 A1 * | 7/2001 | Yamazaki | C23C 14/044 |
| | | | 438/30 |
| 2001/0016427 A1 * | 8/2001 | Ueda | H01L 21/6715 |
| | | | 438/780 |
| 2002/0046946 A1 * | 4/2002 | Shimoda | C23C 14/044 |
| | | | 204/298.25 |
| 2002/0186214 A1 | 12/2002 | Siwinski | |
| 2003/0032210 A1 | 2/2003 | Takayama et al. | |
| 2003/0045131 A1 * | 3/2003 | Verbeke | H01L 21/67069 |
| | | | 438/795 |
| 2003/0124764 A1 * | 7/2003 | Yamazaki | B05D 1/60 |
| | | | 438/99 |
| 2004/0035360 A1 * | 2/2004 | Yamazaki et al. | 118/715 |
| 2004/0185673 A1 * | 9/2004 | Ichijo | C23C 14/3414 |
| | | | 438/758 |
| 2004/0261709 A1 * | 12/2004 | Sakata | C23C 14/243 |
| | | | 118/718 |
| 2006/0111802 A1 * | 5/2006 | Yokoyama | C23C 14/568 |
| | | | 700/108 |
| 2006/0255719 A1 | 11/2006 | Oikawa et al. | |
| 2009/0114534 A1 * | 5/2009 | Green | C23C 14/0623 |
| | | | 204/298.09 |
| 2009/0137103 A1 * | 5/2009 | Yamazaki | H01L 21/67161 |
| | | | 438/479 |
| 2009/0239320 A1 | 9/2009 | Takayama et al. | |
| 2011/0156580 A1 | 6/2011 | Yamazaki | |
| 2011/0198594 A1 | 8/2011 | Yamazaki | |
| 2012/0175244 A1 * | 7/2012 | Yamazaki | C23C 14/568 |
| | | | 204/192.15 |
| 2012/0208303 A1 * | 8/2012 | Yamazaki | H01L 51/56 |
| | | | 438/23 |
| 2015/0236280 A1 * | 8/2015 | Sakuishi | H01L 51/0097 |
| | | | 257/99 |
| 2015/0255615 A1 | 9/2015 | Yamazaki et al. | |

FOREIGN PATENT DOCUMENTS

| | | |
|---|---|---|
| JP | 07-272852 A | 10/1995 |
| JP | 10-294176 A | 11/1998 |
| JP | 2002-018246 A | 1/2002 |
| JP | 2002-62824 | 2/2002 |
| JP | 2002-348659 A | 12/2002 |
| JP | 2003-174153 | 6/2003 |
| JP | 2003-258211 A | 9/2003 |
| JP | 2004-171943 A | 6/2004 |
| JP | 2005-015869 A | 1/2005 |
| JP | 2005-213570 A | 8/2005 |
| JP | 2006-085933 A | 3/2006 |
| JP | 2006-294454 A | 10/2006 |
| JP | 2009-108419 A | 5/2009 |
| JP | 2009-224231 A | 10/2009 |
| JP | 2010-168607 A | 8/2010 |
| WO | WO 03/004719 A1 | 1/2003 |

* cited by examiner

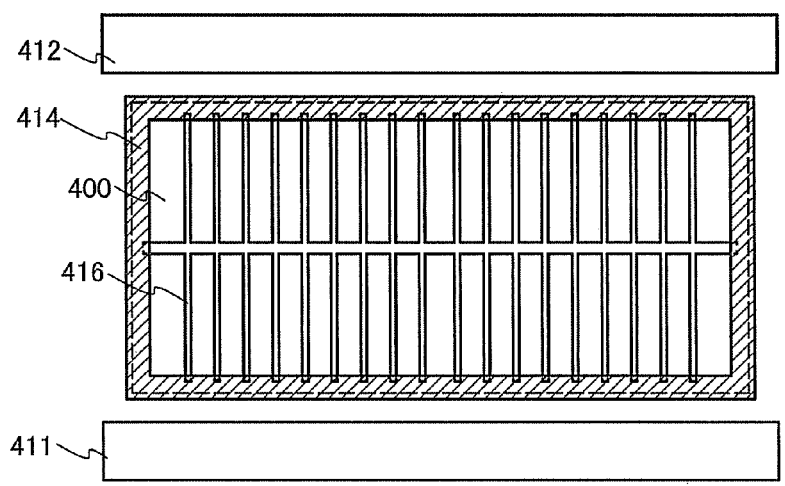
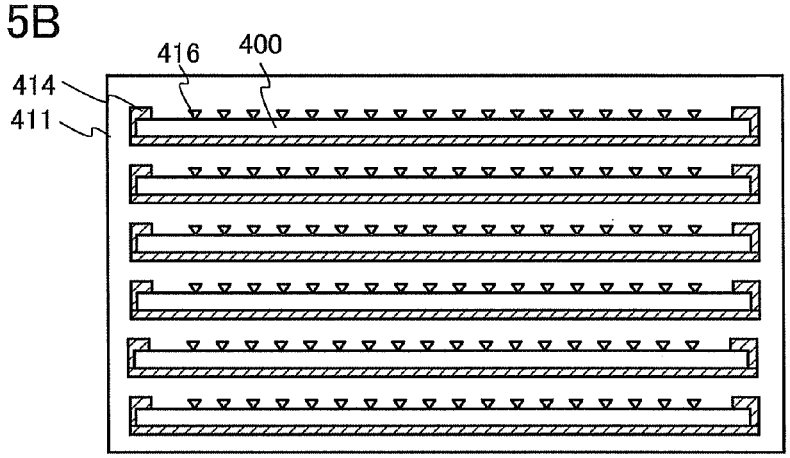
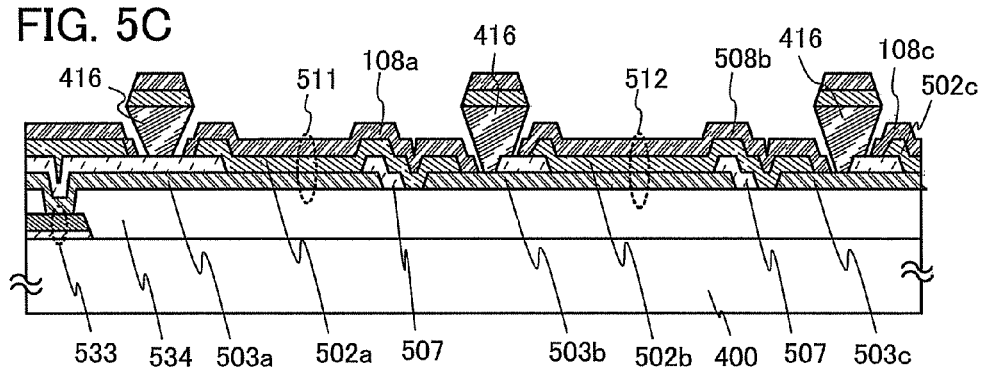

LIGHTING DEVICE, LIGHT-EMITTING DEVICE, AND MANUFACTURING METHOD AND MANUFACTURING APPARATUS THEREOF

BACKGROUND OF THE INVENTION

1. Field of the Invention

One embodiment of the present invention relates to a lighting device and a light-emitting device which include a light-emitting member exhibiting electroluminescence (EL) and also relates to a manufacturing apparatus with which the lighting device and the light-emitting device are manufactured.

2. Description of the Related Art

A light-emitting element containing organic compounds as a luminous body has been expected to be applied to next-generation lighting. The light-emitting element containing organic compounds as a luminous body has features such as drive at a low voltage with low power consumption.

An EL layer included in a light-emitting element includes at least a light-emitting layer. The EL layer can have a layered structure including a hole injection layer, a hole transport layer, an electron transport layer, an electron injection layer, and/or the like, in addition to the light-emitting layer.

It is said that, as for a light-emitting mechanism of a light-emitting element, an EL layer is interposed between a pair of electrodes and voltage is applied to the EL layer, so that electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excited states, and light emission can probably be achieved through either of the excited states.

Further, since the pair of electrodes and the light-emitting layer are formed as films in such a light-emitting element, surface light emission can easily be obtained by forming a large-area light-emitting element. This is a feature which is hard to obtain in light sources such as incandescent lamps and LEDs (point light sources) or in fluorescent lamps (line light sources), so that the above light-emitting element has a high utility value as a light source such as lighting.

A light-emitting element using an organic compound as a luminous body, which has features such as thinness, lightness, high-speed response, and DC drive at a low voltage, is expected to be applied to a next-generation flat panel display. In particular, a display device in which light-emitting elements are arranged in a matrix has advantages of a wide viewing angle and excellent visibility.

Recently, in order to achieve a display capable of full-color display, various structures have been proposed. For example, structures have been examined, such as a structure for performing full-color display by combination of a white light-emitting element and a color filter and a structure for performing full-color display by arrangement of three light-emitting layers of a light-emitting layer exhibiting a red color, a light-emitting layer exhibiting a green color, and a light-emitting layer exhibiting a blue color.

An organic light-emitting device constituted by a pixel group having pixels of four colors of red, green, blue, and white is disclosed in Patent Document 1.

A full-color display device in which a light-emitting device has a plurality of EL elements emitting light of different colors and at least one of the EL elements has a triplet compound and the other EL elements have a singlet compound is disclosed in Patent Document 2.

REFERENCE

Patent Document

[Patent Document 1] United States Published Patent Application No. 2002/0186214
[Patent Document 2] Japanese Published Patent Application No. 2002-62824

SUMMARY OF THE INVENTION

In the case of a full-color light-emitting device in which red light-emitting elements, blue light-emitting elements, and green light-emitting elements are arranged, selective film formation is performed with use of an evaporation mask.

In the case of a lighting device, white light-emitting elements are arranged. Also in the case of forming the white light-emitting elements, an evaporation mask is used to perform selective film formation for each light-emitting layer.

The sizes of an evaporation mask used for a full-color light-emitting device and an evaporation mask used for a lighting device are different from each other. For this reason, separate evaporation masks are necessary, and in the case of processing a large number of substrates at once, many evaporation masks are prepared in accordance with the number of substrates to be processed. Further, formation of organic layers containing a light-emitting substance for forming a red light-emitting element, a blue light-emitting element, and a green light-emitting element needs separate each of the plurality of evaporation apparatus to prevent color mixing, thereby increasing the total footprint of the apparatus. In addition, the evaporation apparatus needs not only an evaporation chamber but also spaces where an alignment unit for alignment of the evaporation masks is provided and spaces where various evaporation masks are put; therefore, the total footprint of the apparatus is further increased.

A full-color display device can be manufactured by using a color filter and white light-emitting elements in combination. In this manner, a full-color display device can be manufactured without using an evaporation mask for a red light-emitting element, an evaporation mask for a blue light-emitting element, and an evaporation mask for a green light-emitting element. When an evaporation mask for a red light-emitting element, an evaporation mask for a blue light-emitting element, and an evaporation mask for a green light-emitting element are used, a margin for alignment is needed, so that a distance between adjacent different color light-emitting regions is long. On the other hand, when these evaporation masks are not used, the margin for alignment is unnecessary, leading to high definition.

By utilizing an inversely tapered or T-shaped partition wall that divides an evaporation film, an organic layer containing a light-emitting substance are selectively formed to form white light-emitting elements without using an evaporation mask; thus, a lighting device and a full-color display device are manufactured.

Therefore, a manufacturing line for a light-emitting device can have some steps in common with a manufacturing line for a lighting device. With the common steps, the total footprint of the manufacturing apparatus is reduced.

An in-line manufacturing apparatus is employed in which a plurality of evaporation chambers for forming an organic layer containing a light-emitting substance are connected in series. With the in-line manufacturing apparatus, a large-sized lighting device or display device can be obtained. Each of the evaporation chambers may be separated by the gate valve.

One embodiment of the invention disclosed in this specification is a manufacturing apparatus including a load chamber, a transfer chamber connected to the load chamber, a plurality of evaporation chambers connected in series to the transfer chamber, a sputtering chamber for forming a protective layer by batch processing, and a sealing chamber for sealing a light-emitting element with use of a base material provided with an optical member.

The insides and junctions of the transfer chamber, the evaporation chambers, the sputtering chamber, and the sealing chamber are tightly sealed so that a substrate is not exposed to the atmosphere while being transferred or stored.

Further, a display device and a lighting device which include a flexible film substrate that is one of flexible base materials can be manufactured.

In the case of manufacturing the display device or the lighting device which includes a flexible film substrate, a separation chamber connected to the sealing chamber of the manufacturing apparatus and a bonding chamber which is connected to the separation chamber and used for bonding a flexible base material may be further provided.

A display device or a lighting device can be manufactured without using an evaporation mask. Since an evaporation mask is not used, a manufacturing apparatus with which both a light-emitting device and a lighting device can be manufactured can be provided.

BRIEF DESCRIPTION OF THE DRAWINGS

In the accompanying drawings:

FIGS. 5A and 5B are schematic views illustrating film formation of one embodiment of the present invention, and FIG. 5C is a cross-sectional view illustrating a lighting device of one embodiment of the present invention;

DETAILED DESCRIPTION OF THE INVENTION

Hereinafter, embodiments of the present invention will be described in detail with reference to the accompanying drawings. Note that the present invention is not limited to the description below and it is easily understood by those skilled in the art that modes and details disclosed herein can be modified in various ways without departing from the spirit and scope of the present invention. Therefore, the present invention is not construed as being limited to description of the embodiments.

Embodiment 1

Figure 1:
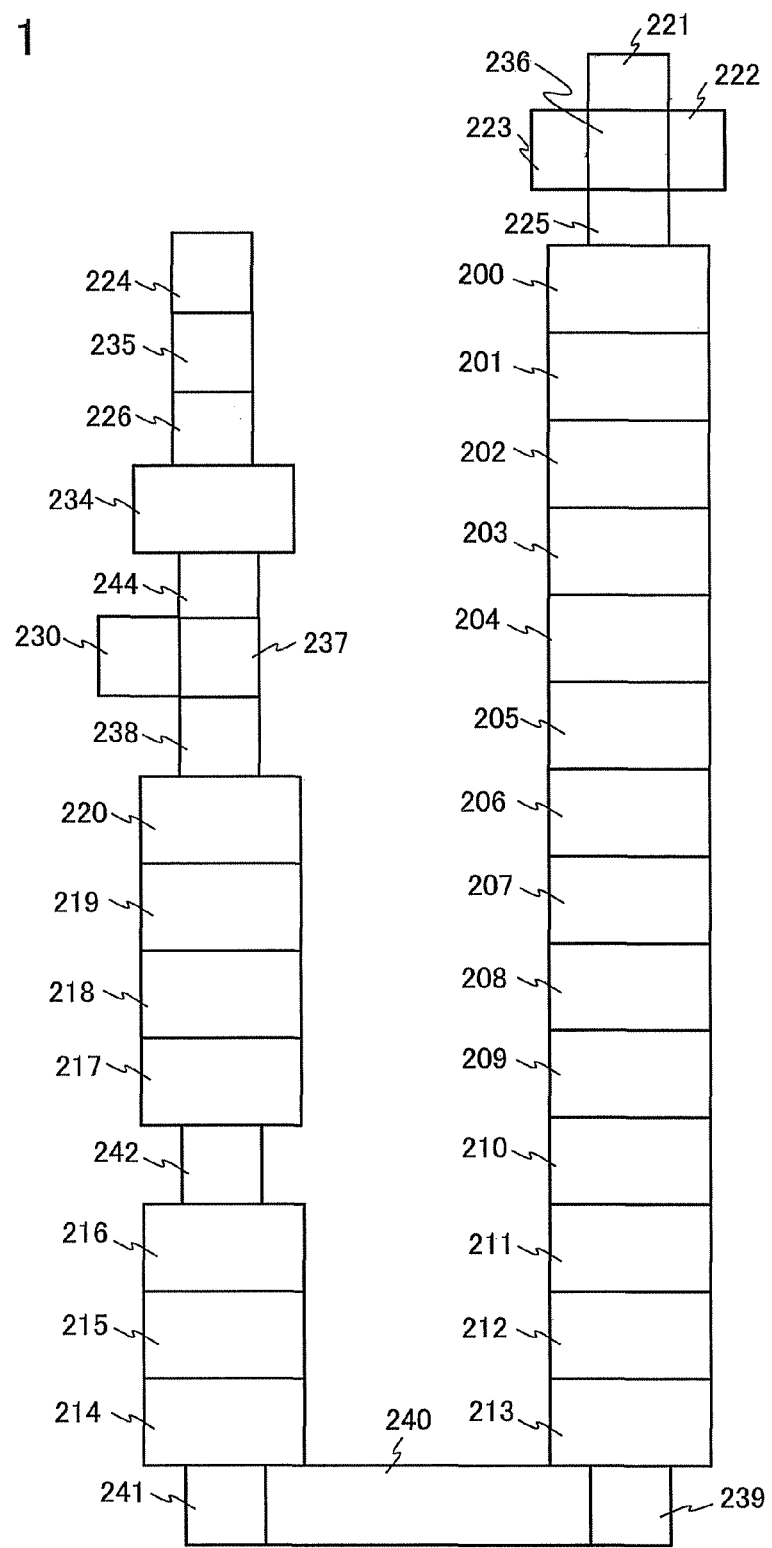
FIG. 1 is a top view illustrating a manufacturing apparatus of one embodiment of the present invention.

FIG. 1 is a top view of an example of an in-line manufacturing apparatus in which a light-emitting element is manufactured and sealed.

The brief description will be given below of a process for manufacturing a top-emission light-emitting device in which a plurality of substrates each provided with a transistor, first electrode layer (reflective electrode), and partition wall is set in a substrate loading chamber (a road chamber), a light-emitting element is formed, and the light-emitting element is sealed.

First, the plurality of substrates is set in any one of substrate loading chambers 221, 222, and 223 depending on the size of the substrates. The followings are examples of the size of a substrate that can be set in the substrate loading chambers 221, 222, and 223: 300 mm×360 mm, 600 mm×720 mm, and 620 mm×750 mm.

Then, the substrate is introduced into a load lock chamber 225 by a transfer robot provided in a transfer chamber 236. In the load lock chamber 225, vacuum baking for removing moisture or the like attached to the substrates, or the like is performed as pretreatment.

Next, the substrates are transferred to an evaporation chamber 200, and the substrates are sequentially subjected to evaporation. In FIG. 1, 14 evaporation chambers 200 to 213 are connected in series, in each of which an organic layer containing a light-emitting substance is formed as appropriate over each of the transferred substrates.

When film formation is performed in an evaporation chamber, a face-down system (also referred to as deposit-up system) is preferably employed, in which case a substrate is set so that a surface on which a film is formed faces downward. The face-down system refers to a manner in which a surface of a substrate, on which a film is formed, faces downward during film formation, and is capable of preventing attachment of dust or the like.

Then, the substrates on which the evaporation has been performed are transferred to a transfer chamber 239, pass through a transfer chamber 240, and then introduced into a transfer chamber 241 which is an anterior chamber of a sputtering chamber.

The transfer chamber 241 which is an anterior chamber of the sputtering chamber has a mechanism for changing the direction of the plurality of substrates, setting the substrates and masks in a substrate holder, and transferring the substrate holder including the plurality of substrates to be processed to the sputtering chamber.

An evacuation unit is connected to the transfer chamber 241, and the pressure in the transfer chamber 241 is reduced so that the degree of vacuum in the transfer chamber 241 is equal to that in the sputtering chamber connected to the transfer chamber 241. A second electrode layer (an electrode having a light-transmitting property) is formed in any one of sputtering chambers 214, 215, and 216 by using, as a sputtering target, aluminum, indium tin oxide (hereinafter called ITO), or indium tin oxide to which silicon oxide is added.

Figure 2:
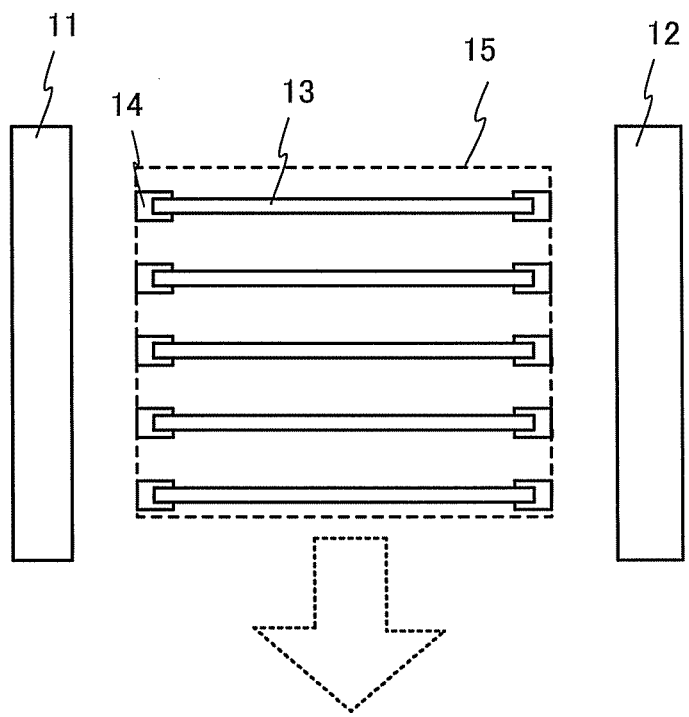
FIG. 2 is a schematic view illustrating part of a sputtering chamber of one embodiment of the present invention.

FIG. 2 illustrates a structural example of one of the sputtering chambers 214, 215, and 216. FIG. 2 illustrates the positional relation of components placed inside the sputtering chamber. With the film formation in the sputtering chamber illustrated in FIG. 2, damage to the organic layer containing a light-emitting substance due to sputtering can be reduced.

In the sputtering chamber, a pair of sputtering targets is placed so that the plurality of substrates 13 fixed by fixing members 14 of a substrate holder 15 are positioned between the pair of sputtering targets. In other words, as illustrated in FIG. 2, the substrate holder 15 is placed so that the surfaces of the substrates are substantially perpendicular to the surfaces of the sputtering targets.

FIG. 2 illustrates an example in which five substrates are stored in the substrate holder as one unit and the substrate holder is moved in the direction indicated by the arrow in FIG. 2 to perform film formation. The substrate holder and the pair of sputtering targets may be moved relative to each other. Therefore, without limitation to the mechanism for moving the substrate holder, a mechanism for moving the pair of sputtering targets or for moving both the substrate holder and the pair of sputtering targets may be employed.

A deposition apparatus for forming a layer by a sputtering method includes the followings: a sputtering chamber including a substrate holder for fixing a substrate to be processed, a target holder for holding a sputtering target, and an electrode corresponding to the sputtering target held in the target holder, in which the pressure can be reduced by a vacuum evacuation unit such as a vacuum pump; a power supply unit which supplies DC voltage (or AC voltage) for sputtering to the electrode; and a gas supply unit which supplies a gas to the sputtering chamber.

In a sputtering method, after the pressure in a sputtering chamber is reduced with a vacuum device, a rare gas such as argon is introduced into the sputtering chamber, and glow discharge is generated between a substrate to be processed as an anode and a sputtering target as a cathode, whereby plasma is generated. Then, positive ions in the plasma are made to collide with the sputtering target, and particles which are components of the sputtering target are sputtered to be deposited over the substrate to be processed, so that a material film is formed.

The thickness of a film formed over a substrate to be processed is inversely proportional to the distance between the substrate to be processed and a sputtering target.

When film formation is performed, direct current (DC) voltage or alternate current (AC) voltage is applied between a first sputtering target 11 and a second sputtering target 12 depending on the material of the sputtering targets. The substrate is set at a floating potential or a fixed potential such as a ground potential.

After the film formation in the sputtering chambers 214, 215, and 216 is completed, the substrates are transferred to a transfer chamber 242.

Figure 3A:
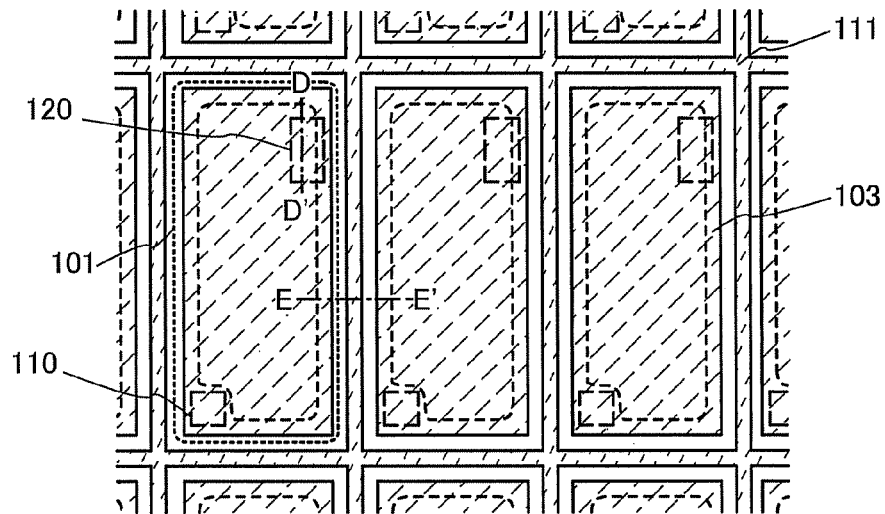
FIGS. 3A and 3B are a top view and a cross-sectional view illustrating a display device of one embodiment of the present invention.
Figure 3B:
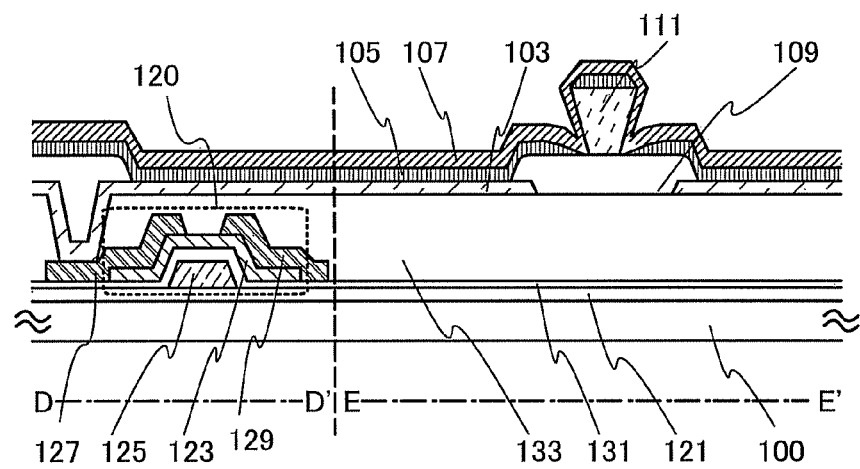

FIGS. 3A and 3B are a cross-sectional view and a top view of the substrate obtained through the steps up to here.

The display device includes a plurality of pixels 101 arranged in a matrix and a partition wall 111 (also called rib) which surrounds the pixels 101. For clarity, FIG. 3A illustrates a pixel including a first electrode layer 103, a light-emitting region indicated by dashed lines on the first electrode layer 103, a region indicated by rectangular dashed lines in which a first transistor 120 is formed, and a region indicated by rectangular dashed lines in which a second transistor 110 is formed. Note that a gate electrode of the second transistor 110 is electrically connected to a storage capacitor and a drain electrode of the first transistor 120. A drain electrode of the second transistor 110 is electrically connected to the first electrode layer 103.

FIG. 3B is a cross-sectional schematic diagram taken along line D-D' and line E-E' in FIG. 3A. The cross section D-D' is a cross-sectional schematic diagram illustrating a region including the first transistor 120 and the second transistor 110 which are provided in the pixel 101. The cross section E-E' is a cross-sectional schematic diagram illustrating a region including two adjacent pixels 101 and the partition wall 111 provided therebetween.

The first transistor 120 includes a gate electrode 125 over a base insulating layer 121, a gate insulating layer 131 over the gate electrode 125, an oxide semiconductor layer 123 over the gate insulating layer 131, a drain electrode 127 electrically connected to the oxide semiconductor layer 123, and a source electrode 129 electrically connected to the oxide semiconductor layer 123.

The oxide semiconductor layer 123 contains at least one element selected from In, Ga, Sn, and Zn. For example, an oxide of four metal elements, such as an In—Sn—Ga—Zn-based oxide semiconductor; an oxide of three metal elements, such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor layer, or a Sn—Al—Zn-based oxide semiconductor; an oxide of two metal elements, such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based material; or an oxide of one metal element, such as an In-based oxide semiconductor, a Sn-based oxide semiconductor, or a Zn-based oxide semiconductor can be used. In addition, any of the above oxide semiconductors may contain an element other than In, Ga, Sn, and Zn. For example, $SiO_2$ may be contained.

For example, an In—Ga—Zn-based oxide semiconductor means an oxide film containing indium (In), gallium (Ga), and zinc (Zn), and there is no limitation on the composition ratio thereof.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case of using an In—Zn—O-based material as an oxide semiconductor, a target has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$: ZnO=15:2 to 3:4 in a molar ratio). For example, in a target used for formation of an In—Zn-based oxide semiconductor which has an atomic ratio of In:Zn:O=X:Y:Z, the relation of Z>1.5X+Y is satisfied.

Voltage or current supplied to the first electrode layer 103 is controlled by switching operation by the first transistor 120 and the second transistor 110, whereby light emission from the pixel 101 is controlled. Note that the first electrode layer 103 is formed over a planarization insulating layer 133 covering the first transistor 120 and the second transistor 110.

The partition wall 111 with an inverse taper shape is formed over a partition wall 109 covering edges of the first electrode layers 103 of the adjacent two pixels 101. At least part of a side surface of the partition wall 111 is in contact with a second electrode layer 107. In order that the pixel 101 emits single color light, preferably white light, although the partition wall 111 with an inverse taper shape is not necessarily provided in every portion between two of the pixels 101, the partition wall 111 with an inverse taper shape is provided in a portion in which the second electrode layer 107 and a common electrode are electrically connected to each other so as to prevent formation of the organic layer 105 containing a light-emitting substance.

Figure 4:
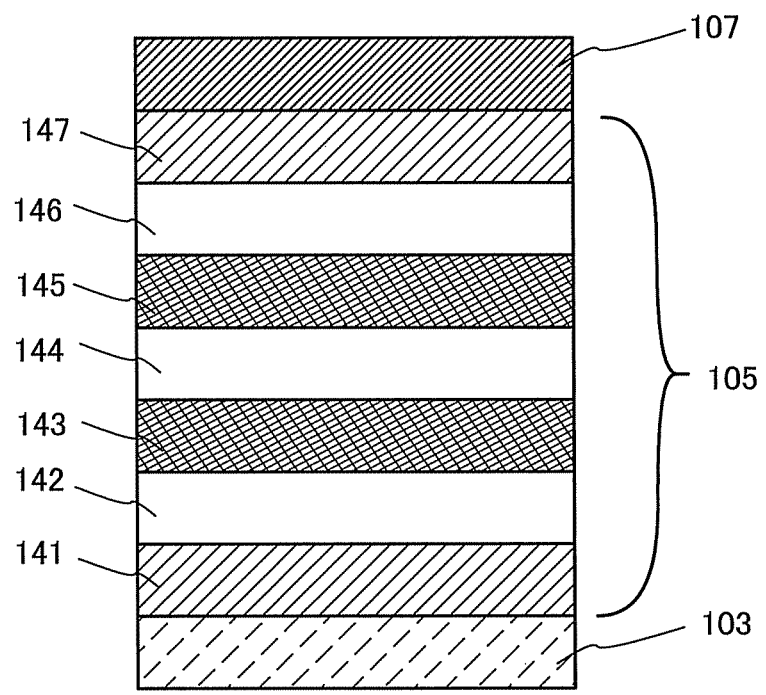
FIG. 4 is a cross-sectional view illustrating an organic layer of one embodiment of the present invention.

A light-emitting element exemplified in this embodiment includes a first electrode layer, a second electrode layer, and an organic layer containing a light-emitting substance. One of the first electrode layer and the second electrode layer serves as an anode and the other serves as a cathode. The organic layer containing a light-emitting substance is provided between the first electrode layer and the second electrode layer, and a structure of the organic layer may be appropriately selected in accordance with materials and the polarities of the first electrode layer and the second electrode layer. An example of a structure of the light-emitting element will be described below; it is needless to say that the structure of the light-emitting element is not limited to this example. FIG. 4 illustrates a stack of the organic layer 105 containing a light-emitting substance as a specific example.

Over the first electrode layer 103, a hole-injection layer 141, a first light-emitting unit 142, an intermediate layer 143, a second light-emitting unit 144, an intermediate layer 145, a third light-emitting unit 146, an electron-injection layer 147, and the second electrode layer 107 are stacked in this order.

Each of the first light-emitting unit 142, the second light-emitting unit 144, and the third light-emitting unit 146 includes at least a light-emitting layer containing a light-emitting substance, and may have a stacked structure of the light-emitting layer and a layer(s) other than the light-emitting layer. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, and a layer containing a substance having a bipolar property (a substance having high electron-and-hole-transport properties). As a light-emitting substance, for example, a fluorescent compound which emits fluorescence or a phosphorescent compound which emits phosphorescence can be used. The use of phosphorescent compounds for emission of all of red (R) light, green (G) light, and blue (B) light makes it possible to obtain high emission efficiency.

FIG. 4 illustrates a stacked element in which three units, which are the first light-emitting unit 142, the second light-emitting unit 144, and the third light-emitting unit 146, are stacked. In the case of the stacked element, light emission color obtained from the first light-emitting unit 142, light emission color obtained from the second light-emitting unit 144, and light emission color obtained from the third light-emitting unit 146 are complementary colors to one another; therefore, white light emission can be extracted to the outside. Note that also in the case where the first light-emitting unit 142, the second light-emitting unit 144, and the third light-emitting unit 146 each have a plurality of light-emitting layers which emits light of complementary colors to one another, white light emission can be obtained. As pairs of complementary colors, blue and yellow, blue green and red, and the like are given.

The hole-injection layer 141 is a layer containing a substance having a high hole-injection property. As the substance having a high hole-injection property, molybdenum oxide, vanadium oxide, ruthenium oxide, tungsten oxide, manganese oxide, or the like can be used, for example. Besides the above, phthalocyanine based compounds such as phthalocyanine ($H_2Pc$) and copper phthalocyanine (CuPc) can be used.

For the hole-injection layer 141, a composite material in which an acceptor substance is added to an organic compound having a high hole-transport property is preferably used. Such a composite material can be formed by co-evaporation of a substance having a high hole-transport property and an acceptor substance. In this embodiment, a composite material of molybdenum oxide and an aromatic amine compound is used for the hole-injection layer 141.

The intermediate layer 143 and the intermediate layer 145 may be formed to include at least a charge generation region, and may have a stacked structure of the charge generation region and a layer other than the charge generation region. The charge generation region is not limited to the structure in which one film contains the substance having a high hole-transport property and the acceptor substance, and may be a stack of a layer containing the substance having a high hole-transport property and a layer containing the acceptor substance. Note that the acceptor substance is preferably added to the charge generation region so that the mass ratio of the acceptor substance to the substance having a high hole-transport property is from 0.1:1 to 4.0:1. Examples of the acceptor substance that is used for the charge production region include a transition metal oxide and an oxide of a metal belonging to Groups 4 to 8 of the periodic table. Specifically, molybdenum oxide is particularly preferable. Note that molybdenum oxide has a low hygroscopic property. As the substance having a high hole-transport property which is used for the charge production region, any of a variety of organic compounds such as an aromatic amine compound, a carbazole derivative, an aromatic hydrocarbon, and a high molecular compound (e.g., an oligomer, a dendrimer, or a polymer) can be used. Specifically, a substance having a hole mobility of $10^{-6}$ $cm^2/Vs$ or higher is preferred. Note that a substance other than the above-described materials may be used as long as the substance has a higher hole-transport property than an electron-transport property.

The electron-injection layer 147 is a layer containing a substance having a high electron-injection property. Examples of the substance having a high electron-injection property include an alkali metal or an alkaline earth metal such as lithium (Li), cesium (Cs), calcium (Ca), lithium fluoride (LiF), cesium fluoride (CsF), and calcium fluoride ($CaF_2$), and a compound thereof. Alternatively, a layer containing a substance having an electron-transport property and an alkali metal, an alkaline earth metal, magnesium (Mg), or a compound thereof (e.g., Alq containing magnesium (Mg)) can be used. In this embodiment, a composite material of molybdenum oxide and an aromatic amine compound is used for the electron-injection layer 147 so that damage due to sputtering can be prevented while the formation of the second electrode layer 107.

Providing a charge-generation layer as one layer included in the organic layer 105 containing a light-emitting substance as illustrated in FIG. 4 enables an element to emit light in a high-luminance region with current density kept low. Since the current density can be kept low, the element can have a long lifetime. In addition, the voltage drop due to resistance of the electrode material can be reduced, whereby uniform light emission in a large area is possible.

Since the display device in this embodiment is of a top emission type, an optical path adjusting film may be formed over the first electrode layer 103 so that interface between top emission from the organic layer 105 containing a light-emitting substance and bottom emission reflected by the first electrode layer 103 is generated to enhance light with a particular wavelength. The optical path adjusting film is preferably formed with a film which has a light-transmitting property and does not affect carrier injection to the organic layer 105 containing a light-emitting substance is preferably used for.

Note that each of the pixels 101 includes at least two transistors, and may include a plurality of transistors or a circuit element such as a capacitor depending on a driving method of the display device or a circuit configuration.

Then, a protective layer is formed over the second electrode layer in the sputtering chambers 217, 218, 219, and 220. Then, the substrate over which the protective layer is formed is transferred to a substrate stock chamber 238.

Examples of the protective layer include a silicon nitride film, a silicon oxide film, a silicon oxynitride film, and an aluminum oxide film. The protective layer can be formed by using silicon, silicon oxide, or aluminum as a sputtering target and supplying an oxygen gas or a nitrogen gas to the sputtering chamber. Alternatively, the protective layer may be formed by introducing an ammonia gas, dinitrogen monoxide, or the like into the sputtering chamber.

A description will be given below of a step of performing sealing with a sealing substrate in order to further improve the reliability.

As the sealing substrate, a substrate provided with an optical member (here, a color filter) in advance is used. The sealing substrates are set in a substrate loading chamber 224 and is introduced into a load lock chamber 226 by a transfer robot provided in a transfer chamber 235. In the load lock chamber 226, vacuum baking for removing moisture or the like attached to the substrate, or the like is performed as pretreatment. Then, the sealing substrates are transferred to a seal pattern forming chamber 234, and a desired seal pattern is formed on the sealing substrates. Then, the sealing substrates are transferred to a sealing substrate stock chamber 244. In the sealing substrate stock chamber 244, baking or light irradiation for temporarily curing of a sealant is performed.

After that, the substrates over which the protective layers are formed and which are stored in the substrate stock chamber 238 and the sealing substrates on which the seal patterns are formed and which are stored in the sealing substrate stock chamber 244 are taken out and transferred to a sealing chamber 230 one by one by a transfer robot provided in a transfer chamber 237. Then, in the sealing chamber 230, the two substrates are aligned and bonded to be fixed to each other.

Lastly, a light-emitting element sealed with the sealing substrate is taken out from the substrate stock chamber 238 or the sealing chamber 230. In the above manner, a top emission type light-emitting device can be manufactured.

Although an active matrix display device including transistors in which an oxide semiconductor layer is used for a channel formation region is described as a manufacturing example in this embodiment, one embodiment of the present invention is not limited thereto. A transistor in which amorphous silicon, microcrystalline silicon, polysilicon, or single crystal silicon is used for a channel formation region may be used. The substrate is not limited to a large-sized substrate and a rectangular substrate; for example, a circular single crystal silicon substrate or a circular SOI substrate may be used. Even when substrates for an active matrix display device and a lighting device are different in shape, since an evaporation mask is not used, the active matrix display device and the lighting device in which substrates are different in size can be manufactured with the same manufacturing apparatus by setting the manufacturing apparatus in accordance to the respective substrate sizes.

Embodiment 2

In Embodiment 1, a manufacturing example of an active matrix display device is described. In this embodiment, a manufacturing example of a lighting device manufactured with the same manufacturing apparatus will be described.

The brief description will be given below of a process in which a plurality of substrates each provided with first electrode layers, second electrode layers, and partition walls is set in any one of the substrate loading chambers 221, 222, and 223, light-emitting elements are formed, and the light-emitting elements are sealed.

The plurality of substrates set in the substrate loading chamber is introduced into a load lock chamber 225 by a transfer robot provided in a transfer chamber 236.

In the load lock chamber 225, vacuum baking for removing moisture or the like attached to the substrates, or the like is performed as pretreatment. The substrates are transferred to an evaporation chamber 200, and evaporation is sequentially performed on the substrates. In FIG. 1, 14 evaporation chambers are connected in series, where an organic layer containing a light-emitting substance is formed as appropriate. The organic layer containing a light-emitting substance is formed to form a white light-emitting element as in Embodiment 1.

The substrates on which the evaporation has been performed are transferred to a transfer chamber 239, and then introduced into the transfer chamber 241 through a transfer chamber 240.

Next, since a top emission type light-emitting element is formed in this embodiment, film formation is performed using ITO or the like by sputtering for forming the second electrode layer. The transfer chamber 241 which is an anterior chamber of the sputtering chambers has a mechanism for changing the direction of the plurality of substrates, setting the substrates and the masks in a substrate holder, and transferring the substrate holder including the plurality of substrates to be processed to the sputtering chambers. Moreover, an evacuation unit is connected to the transfer chamber 241, and the pressure in the transfer chamber 241 is reduced so that the degree of vacuum in the transfer chamber 241 is equal to that in the sputtering chamber connected to the transfer chamber 241. The second electrode layers are selectively formed in any one of the sputtering chambers 214, 215, and 216.

FIGS. 5A and 5B illustrate a state in which the second electrode layer (e.g., ITO) is formed by sputtering over a substrate provided with a second partition wall. FIG. 5A illustrates part of a cross-sectional structure of a sputtering chamber. A second sputtering target 412 is placed so that the second sputtering target 412 overlaps with a first sputtering target 411, and a substrate 400 is placed therebetween. The plane of the substrate 400 and the surface of the first sputtering target 411 form an angle of about 90°. In addition, a second partition wall 416 is provided for the substrate 400, which makes it possible to prevent a short circuit between the first electrode layer and the second electrode layer.

A side surface and a peripheral portion of the substrate 400 are protected by a fixing member 414 with a frame shape so that the second electrode layer is not formed thereover. In particular, the side surface and the peripheral portion of the substrate 400 are close to the sputtering targets, and thus might be damaged due to sputtering. For that reason, it is effective to protect the side surface and the peripheral portion by the fixing member 414.

FIG. 5B is a top view of the sputtering chamber and illustrates a state in which six large substrates are placed over the first sputtering target 411. Each of the substrates 400 is protected by the fixing member 414 with a frame shape, and the second electrode layer is formed in a region which is not covered with the fixing member 414. Since the batch type sputtering apparatus is used, the six substrates may be stored in one cassette to perform film formation. Although the example in which film formation is performed on the six substrates at one time is described here, one embodiment of the present invention is not particularly limited thereto. The number of substrates can be changed as appropriate depending on the size of a substrate and the size of a sputtering target.

FIG. 5C illustrates a cross-sectional structure after the formation of the ITO film functioning as the second electrode layer. The ITO film is formed so as to be divided with the second partition wall 416. The second partition wall 416 prevents a short circuit between the second electrode layers 508*a*, 508*b*, and 508*c* which are positioned with the second partition wall 416 interposed therebetween.

In FIG. 5C, a wiring 533 is formed over the substrate 400. The wiring 533 is covered with a planarization layer 534 and a first electrode layer 503*a* is provided over the planarization layer 534 and electrically connected to the wiring 533. Further, a first partition wall 507 covering the edge of the first electrode layer 503*a* and the second partition wall 416 partly overlapping with the first partition wall 507 are provided. An organic layer 502*a* containing a light-emitting substance is formed in contact with part of a surface, which is not covered with the first partition wall 507, of the first electrode layer 503*a*, and the second electrode layer 508*a* covering the organic layer 502*a* containing a light-emitting substance is formed, thereby forming a first light-emitting element 511. The second electrode layer 508*a* included in the first light-emitting element is electrically connected to the first electrode layer 503*b* included in the second light-emitting element 512. The first light-emitting element and the second light-emitting element are connected in series. The second electrode layer 508*b* included in the second light-emitting element is electrically connected to a first electrode layer 503*c* included in a third light-emitting element adjacent to the second light-emitting element. The second light-emitting element and the third light-emitting element are connected in series.

The organic layer containing a light-emitting substance and the ITO film functioning as the second electrode layer are formed without using an evaporation mask, whereby the organic layer and the ITO film are formed also over the second partition wall 416. With the second partition wall 416, the organic layer 502*a* containing a light-emitting substance included in the first light-emitting element, an organic layer 502*b* containing a light-emitting substance included in the second light-emitting element, and an organic layer 502*c* containing a light-emitting substance included in the third light-emitting element can be formed to have a distance from one another without an evaporation mask. Similarly, with the second partition wall 416, the second electrode layer 508*a* included in the first light-emitting element, the second electrode layer 508*b* included in the second light-emitting element, and the second electrode layer 508*c* included in the third light-emitting element can be formed to have a distance from one another without using an evaporation mask.

Then, the substrates over which the second electrode layers included in the light-emitting elements are formed are transferred to the transfer chamber 242, and then introduced into any one of sputtering chambers 217, 218, 219, and 220 where protective layers are formed. Then, the substrates over which the protective layers are formed are transferred to a substrate stock chamber 238.

A step of performing sealing with a sealing substrate having a light-transmitting property in order to improve the reliability of the light-emitting element will be described below.

The sealing substrates are set in the substrate loading chamber 224 and are introduced into the load lock chamber 226 by a transfer robot provided in a transfer chamber 235. In the load lock chamber 226, vacuum baking for removing moisture or the like attached to the substrates, or the like is performed as pretreatment. Then, the sealing substrates are transferred to the seal pattern forming chamber 234, and a desired seal pattern is formed on the sealing substrates. Then, the sealing substrates are transferred to a sealing substrate stock chamber 244. In the sealing substrate stock chamber 244, baking or light irradiation for temporarily curing of a sealant is performed.

After that, the substrates over which the protective layers are formed and which are stored in the substrate stock chamber 238 and the sealing substrates on which the seal patterns are formed and which are stored in the sealing substrate stock chamber 244 are taken out and transferred to a sealing chamber 230 one by one by a transfer robot provided in a transfer chamber 237. Then, in the sealing chamber 230, the two substrates are aligned and bonded to be fixed to each other.

In the case of manufacturing a lighting device with high luminance, a sealing substrate to which a microlens array or the like is fixed as an optical member may be bonded to the substrate in the sealing chamber 230. In the case of manufacturing a lighting device with high uniformity in luminance, a sealing substrate to which a diffusing plate or the like is fixed as an optical member may be bonded to the substrate in the sealing chamber 230.

Lastly, a light-emitting element sealed with the sealing substrate is taken out from the substrate stock chamber 238 or the sealing chamber 230. In the above manner, a lighting device which is a top emission type light-emitting device can be manufactured.

In the lighting device which is a top emission type light-emitting device, the layers for the organic layer containing a light-emitting substance between the first electrode layer and the second electrode layer can be stacked in the same order as those in the display device in Embodiment 1; thus, the lighting device and the display device can be manufactured with a common manufacturing apparatus. Since it is not necessary to prepare different manufacturing apparatuses, the total footprint of the manufacturing apparatus can be reduced as compared with the sum of footprints of a manufacturing apparatus for the display device and a manufacturing apparatus for the lighting device. In addition, an organic compound material can be utilized effectively.

Embodiment 3

In this embodiment, an example of a method for manufacturing a display device including a flexible film substrate will be described below.

Figure 6:
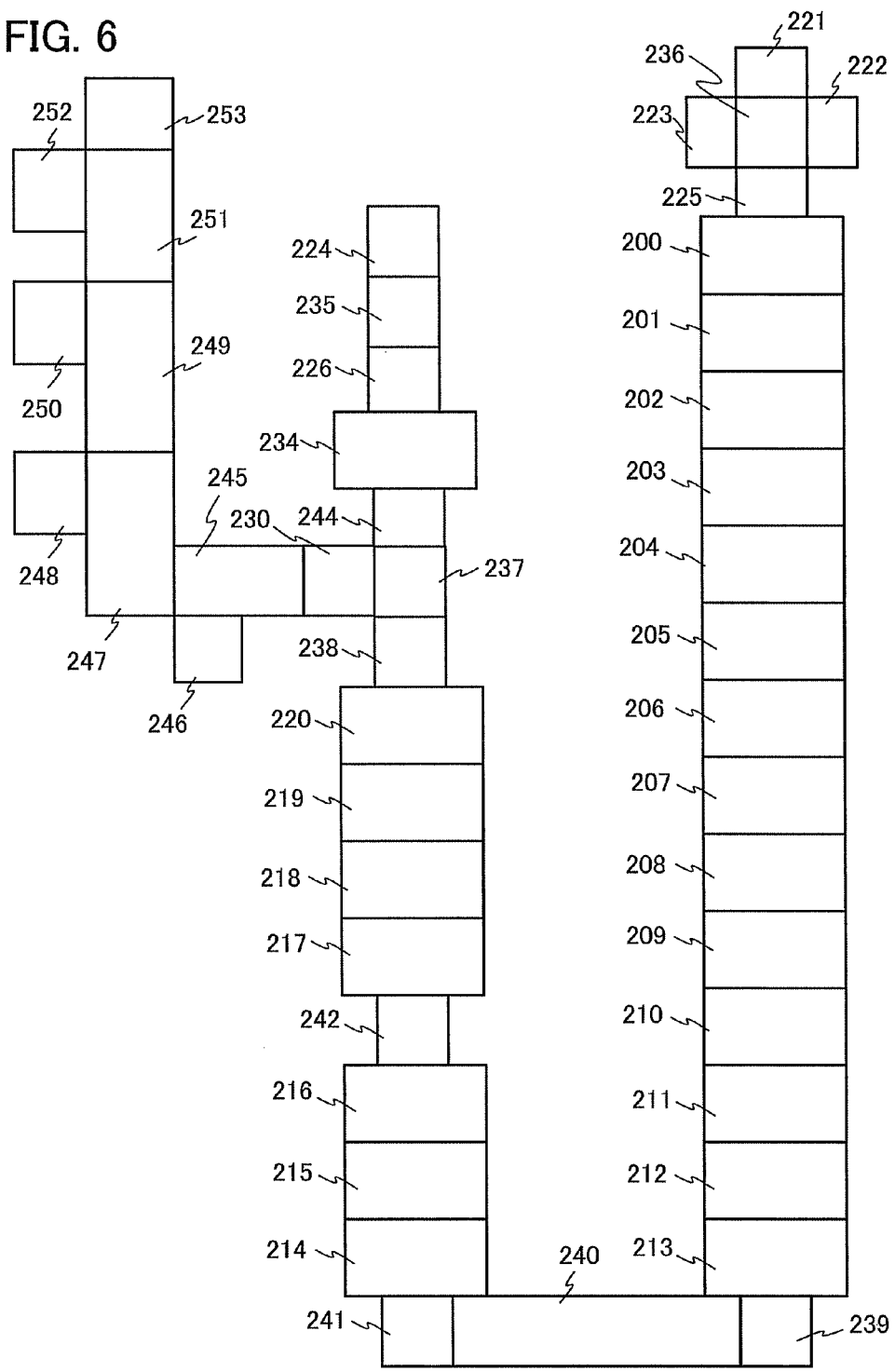
FIG. 6 is a top view illustrating a manufacturing apparatus of one embodiment of the present invention.

The brief description will be given below of a process for manufacturing a flexible top emission type light-emitting device. The process includes setting, in a substrate loading chamber, a substrate where a layer including a transistor is formed over the first separation layer, forming a light-emitting element, bonding a sealing substrate in which a color filter is formed over a second separation layer to the substrate, and separating the substrates. The case of using the manufacturing apparatus illustrated in FIG. 6 will be described with reference to FIGS. 7A to 7C which illustrate part of the cross-section of the display device. For simplicity, in FIG. 6, the same reference numerals are used for the same parts as those in FIG. 1; and in FIGS. 7A to 7C, the same reference numerals are used for the same parts as those in FIG. 3B.

First, a separation layer 701 is formed over the substrate 100. The separation layer 701 is formed to separate a stacked-layer body to be formed later from the substrate 100. By using technology disclosed in Japanese Published Patent Application No. 2003-174153, a transistor can be formed over a flexible base material or a flexible film. In this embodiment, the separation layer 701 is formed of a tungsten film. A method for forming the TFT over a flexible plastic film is not limited to that disclosed in Japanese Published Patent Application No. 2003-174153. For example, following methods can be employed: a method in which a separation layer is formed between a layer to be separated and a substrate, and the separation layer is removed by a solution (an etchant) or an etching gas to separate the layer to be separated and the substrate; and a method in which a separation layer formed of amorphous silicon (or polysilicon) is formed between a layer to be separated and a substrate, and hydrogen contained in amorphous silicon is released by irradiating the amorphous silicon with laser light passing through the substrate, so that voids are generated and the layer to be separated and the substrate are separated.

Next, the base insulating layer 121 of a thin film transistor is formed over a surface of the separation layer 701. The base insulating layer 121 can be formed as a single layer film or a multi-layer film using a material selected from silicon oxide, silicon nitride, silicon nitride oxide ($SiO_xN_y$), and the like, to prevent contamination of the thin film transistor. Films of these materials can be formed by a CVD method or a sputtering method. Note that in the case where a film that does not contain oxygen is used as the base insulating layer 121 which is in contact with the tungsten film functioning as the separation layer 701, after the surface of the tungsten film is oxidized by thermal oxidation treatment, oxygen plasma treatment, or oxidation treatment by solution having high oxidizability, such as ozone water to obtain a tungsten oxide layer, the base insulating layer 121 is formed and then separation of the substrate is performed in a later step.

Next, a transistor, the first electrode layer, the partition wall 109, and the partition wall 111 are formed over the base insulating layer 121 as in Embodiment 1. The substrate over which the partition wall 111 is formed is set in any one of the substrate, loading chambers 221, 222, and 223 of the manufacturing apparatus as in Embodiment 1.

Then, the substrate is transferred to the evaporation chambers 200 to 213 to form the organic layer 105 containing a light-emitting substance, and the second electrode layer 107 is formed in the sputtering chambers 214, 215, and 216.

Then, a protective layer 138 is formed over the second electrode layer 107 in the sputtering chambers 217, 218, 219, and 220. Then, the substrate over which the protective layer 138 is formed is transferred to a substrate stock chamber 238.

Next, a process for bonding with use of a substrate 700 provided with an optical member (here, a color filter) in advance will be described below with reference to FIGS. 7A to 7C. A substrate further provided with a polarizing film as an optical member may be used, if necessary.

The substrate 700 is provided with a separation layer 702. A base insulating layer 703 is provided over the separation layer 702. The separation layer 702 and the base insulating layer 703 can be formed in a manner similar to that of the separation layer 701 and the base insulating layer 121 which are formed over the substrate 100.

A black matrix 704, a first coloring layer 705a, a second coloring layer 705b, and an overcoat layer 706 are formed over the base insulating layer 703. The black matrix 704, the first coloring layer 705a, and the second coloring layer 705b function as a color filter.

The thus obtained substrate 700 is set in the substrate loading chamber 224 and is introduced into the load lock chamber 226 by a transfer robot provided in the transfer chamber 235. In the load lock chamber 226, vacuum baking for removing moisture or the like attached to the substrate, or the like is performed as pretreatment. Then, the substrate 700 is transferred to the seal pattern forming chamber 234, and a desired seal pattern is formed on the substrate 700. Since the substrate is separated in a later step in this embodiment, a seal pattern is employed so that a sealant fills a space between the substrate 700 and the protective layer 138 and air does not exist therebetween. A resin having a light-transmitting property is used for the sealant. Then, the substrate 700 is transferred to the sealing substrate stock chamber 244. In the sealing substrate stock chamber 244, baking or light irradiation for temporarily curing a sealant is performed.

After that, the substrates over which the protective layers 138 are formed and which are stored in the substrate stock chamber 238 and the substrates 700 on which the seal patterns are formed and which are stored in the sealing substrate stock chamber 244 are taken out and transferred to the sealing chamber 230 one by one by a transfer robot provided in the transfer chamber 237. Then, in the sealing chamber 230, the two substrates are aligned and bonded to be fixed to each other.

Figure 7A:
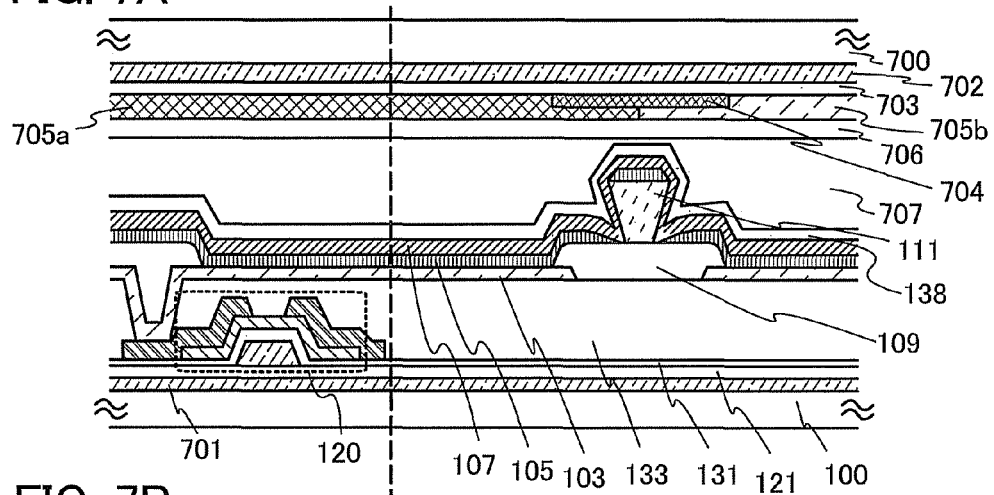
FIGS. 7A to 7C are cross-sectional views illustrating a display device of one embodiment of the present invention.

FIG. 7A is a cross-sectional view illustrating a state where a pair of substrates is bonded with a sealant 707 in the sealing chamber 230.

Then, the pair of substrates bonded is transferred to a first separation chamber 245. In the first separation chamber 245, the substrate 100 is separated by weakening the bonding strength of the molecules at the interface between the separation layer 701 and a layer in contact with the separation layer 701. In this embodiment, a physical means is used for the separation of the substrate 100 in the first separation chamber 245. The physical means refers to a dynamic means or a mechanical means; for example, a means for changing some dynamical energy (mechanical energy). Typically, the physical means is an action of applying mechanical force (e.g., a peeling process with a human hand or with a gripper, or a separation process by rotating a roller). In the first separation chamber 245, a device for forming a trigger of the separation of the substrate 100, a device for separation of the substrate, a transfer unit to transfer the substrate 100 which has been subjected to the separation, and the like are provided. Note that the substrate 100 which has been subjected to the separation is stored in a substrate stock chamber 246.

Next, the substrate 700 is transferred to a first bonding chamber 247. A flexible base material 709 is fixed over a surface of the base insulating layer 121 which is exposed by the separation of the substrate 100. The flexible base material 709 is supplied from a film supply chamber 248, and the base insulating layer 121 and the flexible base material 709 are bonded to each other in the first bonding chamber 247.

Figure 7B:
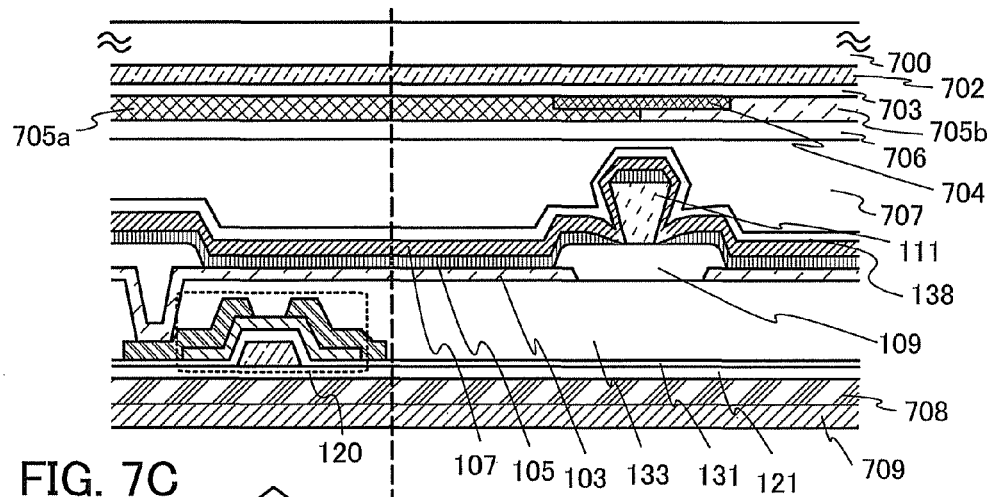

FIG. 7B is a cross-sectional view illustrating a state where the flexible base material 709 and the base insulating layer 121 are bonded with a first adhesive 708 in the first bonding chamber 247.

Next, the pair of substrates bonded is transferred to a second separation chamber 249. In the second separation chamber 249, separation of the substrate 700 is performed, and the substrate 700 which has been subjected to the separation is stored in a substrate stock chamber 250. In the second separation chamber 249, a device for forming a trigger of the separation of the substrate 700, a device for separation of the substrate, a transfer unit to transfer the substrate 700 which has been subjected to the separation, and the like are provided. In this embodiment, a physical means is used for the separation of the substrate 700 in the second separation chamber 249.

Next, the flexible base material 709 which is bonded to the base insulating layer 121 is transferred to a second bonding chamber 251. A flexible base material 711 is fixed over a surface of the base insulating layer 703 which is exposed by the separation. The flexible base material 711 is supplied from a film supply chamber 252, and the base insulating layer 703 and the flexible base material 711 are bonded to each other in the second bonding chamber 251.

As the flexible base materials 709 and 711, a resin material such as polyester, polypropylene, polyvinyl chloride, polystyrene, polyacrylonitrile, polyethylene terephthalate, or polyamide can be used. As a base material film, an adhesive synthetic resin film such as an acrylic resin, an epoxy resin, a vinyl acetate resin, a vinyl copolymer resin, or an urethane resin can be used. Since a top emission type light-emitting device is formed in this embodiment, a metal film that does not have a light-transmitting property can be used for the flexible base material 709; for example, a film made of stainless steel can be used. With use of the film made of stainless steel as the flexible base material 709, moisture and the like can be blocked; thus, reliability of the light-emitting element is increased and heat generated by the light-emitting element or the transistor can be released.

Figure 7C:
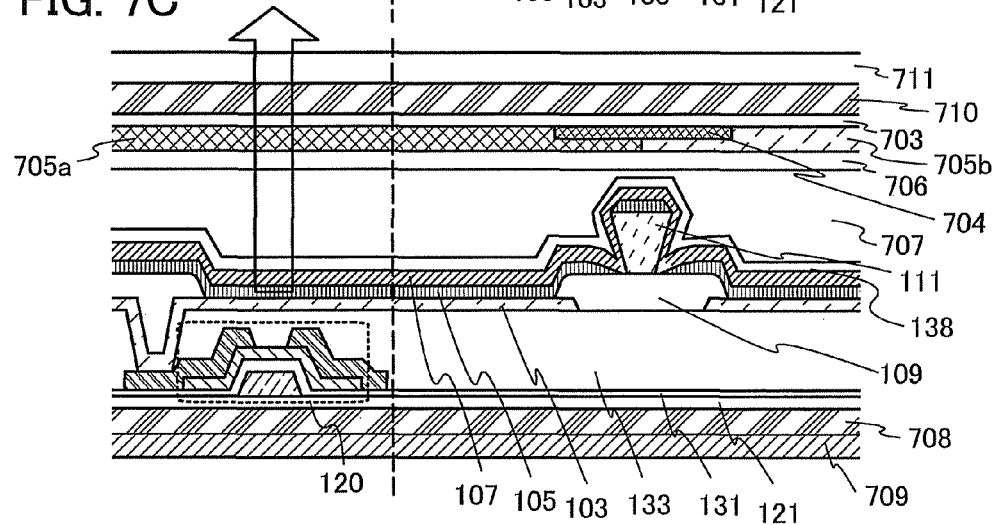

FIG. 7C is a cross-sectional view illustrating a state where the flexible base material 711 and the base insulating layer 703 are bonded with a second adhesive 710 in the second bonding chamber 251.

The pair of flexible base materials which has been subjected to the bonding is transferred to an extraction chamber 253 to be taken out from the manufacturing apparatus. Through the above steps, with the manufacturing apparatus illustrated in FIG. 6, a flexible display device including the pair of flexible base materials can be manufactured.

This embodiment can be freely combined with the other embodiments. For example, a flexible lighting device including a pair of flexible base materials can be manufactured by combining this embodiment and Embodiment 2.

This application is based on Japanese Patent Application serial no. 2011-028920 filed with Japan Patent Office on Feb. 14, 2011, the entire contents of which are hereby incorporated by reference.

What is claimed is:

1. A method for manufacturing a light emitting device comprising the steps of:
   providing first substrates in a load chamber;
   sequentially transferring the first substrates via a transfer chamber from the load chamber to evaporation chambers, wherein the evaporation chambers are connected in series to each other;
   forming a layer comprising a light-emitting substance over each of the first substrates in the evaporation chambers;
   providing the first substrates in a substrate folder after forming the layer;
   forming an electrode over each of the first substrates in the substrate folder by batch processing in a first sputtering chamber;
   forming a protective layer over each of the first substrates in the substrate folder by batch processing in a second sputtering chamber after forming the electrode; and
   sequentially sealing each of the first substrates with a second substrate provided with an optical member in a sealing chamber,
   wherein the step of forming the layer is performed without an evaporation mask in the evaporation chambers, and
   wherein the first substrates in the substrate folder are arranged in parallel rows.

2. The method for manufacturing the light emitting device according to claim 1, wherein the electrode has a light-transmitting property.

3. The method for manufacturing the light emitting device according to claim 1, wherein a surface of each of the first substrates in the substrate folder is provided perpendicular to a surface of a target in each of the first sputtering chamber and the second sputtering chamber.

4. The method for manufacturing the light emitting device according to claim 1, further comprising the step of: separating each of the first substrates in a separation chamber after sealing each of the first substrates with the second substrate.

5. The method for manufacturing the light emitting device according to claim 1, further comprising the steps of:
   separating each of the first substrates in a separation chamber after sealing each of the first substrates with the second substrate; and
   bonding a flexible base material to a surface separated from the first substrates in a bonding chamber after separating each of the first substrates.

6. The method for manufacturing the light emitting device according to claim 1, further comprising the steps of:
   separating each of the first substrates in a first separation chamber after sealing each of the first substrates with the second substrate;
   bonding a first flexible base material to a first surface separated from each of the first substrates in a first bonding chamber;
   separating the second substrate in a second separation chamber after bonding the first flexible base material to the first surface; and
   bonding a second flexible base material to a second surface separated from the second substrate in a second bonding chamber,
   wherein the second surface is opposite to the first surface.

7. The method for manufacturing the light emitting device according to claim 1, wherein the optical member is a color filter or a microlens array.

8. The method for manufacturing the light emitting device according to claim 1, wherein each of the first substrates is provided with a transistor.

9. The method for manufacturing the light emitting device according to claim 1, wherein the layer is formed so as to have a stacked structure of a first light-emitting unit, a second light-emitting unit, and a third light-emitting unit.

* * * * *